(12) United States Patent
Su

(10) Patent No.: US 11,106,005 B2
(45) Date of Patent: Aug. 31, 2021

(54) PRISM ROTATION ADJUSTMENT MECHANISM, STEPPER EXPOSURE SYSTEM, AND STEPPER

(71) Applicant: SHANGHAI MICRO ELECTRONICS EQUIPMENT (GROUP) CO., LTD., Shanghai (CN)

(72) Inventor: Tongke Su, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 330 days.

(21) Appl. No.: 16/067,375

(22) PCT Filed: Dec. 28, 2016

(86) PCT No.: PCT/CN2016/112572
§ 371 (c)(1),
(2) Date: Jun. 29, 2018

(87) PCT Pub. No.: WO2017/114405
PCT Pub. Date: Jul. 6, 2017

(65) Prior Publication Data
US 2019/0018218 A1    Jan. 17, 2019

(30) Foreign Application Priority Data
Dec. 30, 2015 (CN) .......................... 201511026041.9

(51) Int. Cl.
*G02B 7/18* (2021.01)
*G03F 7/20* (2006.01)
(Continued)

(52) U.S. Cl.
CPC ............. *G02B 7/1805* (2013.01); *G02B 5/04* (2013.01); *G02B 7/005* (2013.01); *G03F 7/201* (2013.01);
(Continued)

(58) Field of Classification Search
CPC ........ G02B 7/1805; G02B 7/005; G02B 5/04; G02B 7/18; G02B 7/12; G02B 7/646;
(Continued)

(56) References Cited

U.S. PATENT DOCUMENTS 6,606,426 B2 * 8/2003 Laor ...................... G02B 6/357
385/15
7,764,447 B2 * 7/2010 Shibazaki ........... G03F 7/70825
359/813
(Continued)

FOREIGN PATENT DOCUMENTS

CN        1317725 A     10/2001
CN        1560660 A      1/2005
(Continued)

*Primary Examiner* — William R Alexander
*Assistant Examiner* — Rahman Abdur
(74) *Attorney, Agent, or Firm* — Muncy, Geissler, Olds & Lowe, P.C.

(57) ABSTRACT

A prism rotation adjustment mechanism, a photolithographic exposure system and a photolithography tool are disclosed. The prism rotation adjustment mechanism includes a frame (200), a flexible mechanism (100) and an actuation mechanism. The flexible mechanism (100) includes a fixing component (110), an actuating component (120), a connecting component (130) and a swinging component (140) that are flexibly articulated in a sequence. The fixing component (110) is fixed to the frame (200). The actuation mechanism is fixed to the frame (200) and coupled to the actuating component (120). On the swinging component (140) are secured a prism wherein an axis of articulation between the swinging component (140) and the fixing component (110) is in correspondence with a rotational center of the prism. The flexible mechanism of the prism rotation adjustment mechanism is a quadrilateral flexibly-articulated assembly, in which, when driven by the actuation mechanism, the actuating component can convert translational movement
(Continued)

into rotational movement, allowing the control of the rotational movement to be more accurate and hence improving the rotational control accuracy of the prisms. Moreover, the axis of articulation between the swinging component and the fixing component provides a stable axis for the prisms to rotate thereabout, avoiding crosstalk during the rotation and hence additionally improving the prism rotation control accuracy.

13 Claims, 4 Drawing Sheets

(51) Int. Cl.
 *G02B 7/00* (2021.01)
 *G02B 5/04* (2006.01)
(52) U.S. Cl.
 CPC ...... *G03F 7/70225* (2013.01); *G03F 7/70258* (2013.01); *G03F 7/70825* (2013.01)
(58) Field of Classification Search
 CPC . G02B 7/023; G03F 7/70825; G03F 7/70258; G03F 7/70225; G03F 7/201; G03F 7/709; G03F 7/20; G03F 7/70275; E05D 15/48; A61B 17/3421; A61B 17/064; A61B 34/70; A61B 1/00087; A61B 17/07207; A61B 7/068; A61B 17/0686; A61B 34/30; B60Q 1/0683; B60R 1/074; B60R 1/062; H02S 20/10; A47C 7/68
 USPC ........................................................ 359/831
 See application file for complete search history.

(56) References Cited

U.S. PATENT DOCUMENTS

| | | | | |
|---|---|---|---|---|
| 8,085,482 B2 * | 12/2011 | Frankovich | ............ | G02B 7/005 359/824 |
| 9,354,422 B1 * | 5/2016 | Quakenbush | ........ | H02K 41/035 |
| 9,632,413 B2 * | 4/2017 | Saenger | .............. | G03F 7/70191 |
| 10,379,314 B2 * | 8/2019 | Honsho | ............... | F16C 11/0614 |
| 2008/0019817 A1 * | 1/2008 | Komiya | ................... | B23Q 1/44 414/749.6 |
| 2009/0141360 A1 * | 6/2009 | Koyama | ................... | G02B 5/04 359/618 |
| 2013/0103145 A1 * | 4/2013 | John | ...................... | A61F 9/013 623/6.12 |

FOREIGN PATENT DOCUMENTS

| | | | | |
|---|---|---|---|---|
| CN | 201611424 U | | 10/2010 | |
| CN | 202533713 U | | 11/2012 | |
| CN | 103901576 A | | 7/2014 | |
| CN | 104280858 A | * | 1/2015 | ............ G02B 7/183 |
| CN | 104280858 A | | 1/2015 | |
| CN | 104391367 A | | 3/2015 | |
| CN | 204269905 U | | 4/2015 | |
| CN | 105403977 A | | 3/2016 | |
| CN | 103901576 B | * | 9/2016 | ............... G02B 7/02 |
| JP | 2000338430 A | | 12/2000 | |
| JP | H7218863 A | | 8/2015 | |
| WO | WO2010131490 A1 | | 11/2010 | |

* cited by examiner

Detector Displacement (μm)

PRISM ROTATION ADJUSTMENT MECHANISM, STEPPER EXPOSURE SYSTEM, AND STEPPER

TECHNICAL FIELD

The present invention relates to photolithographic equipment and, in particular, to a prism rotation adjustment mechanism, a photolithographic exposure system and a photolithography tool.

BACKGROUND

Photolithography is a process to transfer a pattern from a photomask to a substrate by means of exposure. During this process, the substrate is supported on a workpiece stage and an exposure apparatus incorporated in a photolithography tool projects an image of the photomask pattern onto the surface of the substrate. Exposure is critical to the photolithography process and can be accomplished in a contact, proximity, projection or direct-write manner. Projection exposure is performed with an optical system for light convergence between the photomask and photoresist. Projection photolithography is of great significance to the fabrication of large-scale integrated circuits, in which the image transfer capabilities of the projection photolithography tools used are determined by projection objectives that are considered as the core component of the tools. These projection objectives usually rely on prisms for optical path handling.

During an exposure process carried out by an exposure system, deviations of an image plane from its desired position may arise from irregularities on the photomask surface (including those caused by machining errors and deformations from gravity and clamping) as well as from changes in the ambience. In such a case, in order to ensure the image quality, positional adjustments of the image plane is necessary, which can be achieved by, for example, for a catadioptric objective employing a right-angle prism, adjusting the position of the right-angle prism using an adjustment mechanism.

Conventional objective adjustment mechanisms rely on piezoelectric ceramic motors in direct connection with the objective prisms for enabling translation and rotation of the prisms. In this technique, prism control accuracy of the objective adjustment mechanisms is dependent on, and thus limited by, control accuracy of the piezoelectric ceramic motor. In addition, crosstalk-free rotation adjustments of a prism require simultaneous actuation by two piezoelectric ceramic motors.

SUMMARY OF THE INVENTION

It is an object of the present invention to provide a prism rotation adjustment mechanism with higher prism rotation adjustment accuracy and free of crosstalk during rotation, as well as a photolithographic exposure system and a photolithography tool.

To this end, the subject matter of the present invention lies in a prism rotation adjustment mechanism, comprising a frame, a flexible mechanism and an actuation mechanism, the flexible mechanism comprising a fixing component, an actuating component, a connecting component and a swinging component that are flexibly articulated in a sequence, the fixing component fixed to the frame, the actuation mechanism fixed to the frame and coupled to the actuating component, the swinging component configured to secure a prism, wherein an axis of articulation between the swinging component and the fixing component is in correspondence with a rotational center of the prism.

Preferably, the fixing component may be, at one end, in flexible articulation with a middle portion of the actuating component, wherein one end of the actuating component is in flexible articulation with one end of the connecting component and the other end of the actuating component is a free end, wherein the connecting component is, at the other end, in flexible articulation with the swinging component, and wherein the swinging component is flexibly articulated, in a middle portion thereof, to the fixing component.

Further, the actuation mechanism may be coupled to the free end.

Further, the prism rotation adjustment mechanism may further comprise a pretension unit having one end abutting against the fixing component and the other end fixed to the free end.

Further, the pretension unit may be implemented as a spring abutting against the fixing component at one end and fixed to the free end at the other end.

Preferably, the prism rotation adjustment mechanism may further comprise a detection unit and a corresponding detection bracket thereof, the detection bracket vertically coupled to the swinging component, the detection unit fixed to the frame and constituting a closed-loop control system together with the actuation mechanism.

Preferably, the detection bracket may be aligned with the detection unit after penetrating the fixing component.

Preferably, the actuation mechanism may comprise an actuator support and an actuator unit mounted on the actuator support, the actuator support in fixed connection with the frame, the actuator unit coupled to the actuating component.

Further, the actuator unit may be implemented as a piezoelectric ceramic motor.

Preferably, the fixing component, the actuating component, the connecting component and the swinging component may all be block-shaped.

Preferably, the fixing component, the actuating component, the connecting component and the swinging component may be formed from one piece.

Compared with the prior art, the flexible mechanism of the prism rotation adjustment mechanism of the present invention is a quadrilateral flexibly-articulated assembly, in which, the actuating component can convert translational movement of the actuation mechanism into swinging of the swinging component via mechanical transmission of the connecting component and the fixing component and hence into rotation of the prisms on the swinging component. This allows the control of the rotational movement to be more accurate and hence to improve the rotation control accuracy of the prisms. Additionally, the axis of articulation between the swinging component and the fixing component provides a stable axis for the prism to rotate thereabout, thus ensuring the avoidance of crosstalk during the rotation and additionally improving the prism rotation control accuracy.

The above object is also attained by a photolithographic exposure system provided in the present invention, comprising a projection objective and the prism rotation adjustment mechanism as defined above. The projection objective includes a number of prisms fixedly attached to the prism rotation adjustment mechanism.

Compared with the prior art, the prism rotation adjustment mechanism in the photolithographic exposure system of the present invention can convert translational movement into rotational movement, allowing the control of the rotational movement to be more accurate and hence improving the rotation control accuracy of the prisms. Moreover, the axis of articulation between the swinging component and the fixing component provides a stable axis for the prisms to rotate thereabout, ensuring the avoidance of crosstalk during the rotation and hence additionally improving the prism rotation control accuracy.

The above object is also attained by a photolithography tool provided in the present invention, comprising the photolithographic exposure system as defined above.

Compared with the prior art, the prism rotation adjustment mechanism in the photolithography tool of the present invention can convert translational movement into rotational movement, allowing the control of the rotational movement to be more accurate and hence improving the rotation control accuracy of the prisms. Moreover, the axis of articulation between the swinging component and the fixing component provides a stable axis for the prisms to rotate thereabout, ensuring the avoidance of crosstalk during the rotation and hence additionally improving the prism rotation control accuracy.

In the figures, 100 denotes a flexible mechanism; 110, a fixing component; 111, a through hole in the fixing component; 120, an actuating component; 121, a through hole in the actuating component; 130, a connecting component; 140, a swinging component; 200, a frame; 300, an actuator support; 400, an actuator unit; 500, a pretension unit; 600, a detection unit; 700, a detection bracket; 800, a prism; K1, a first axis of articulation; K2, a second axis of articulation; K3, a third axis of articulation; K4, a fourth axis of articulation; a, an angle of deflection of the actuating component; and β, an angle of deflection of the swinging component.

DETAILED DESCRIPTION

The present invention will be described in detail with reference to the accompanying drawings.

Figure 1:
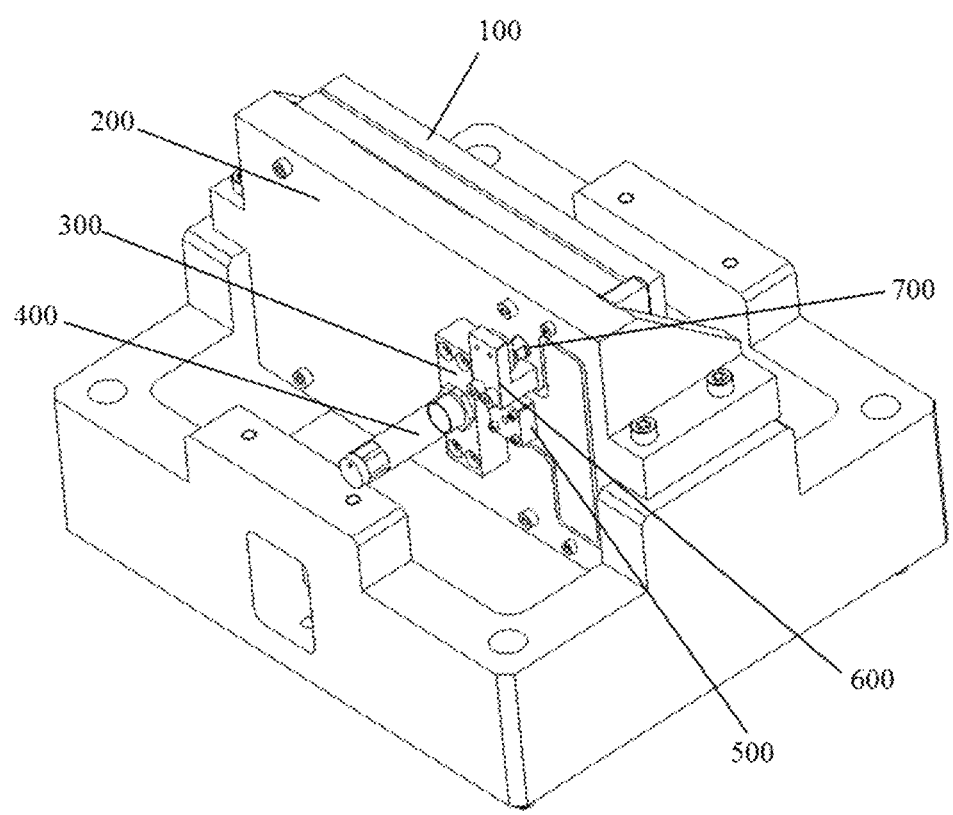
FIG. 1 is a structural schematic of a prism rotation adjustment mechanism according to an embodiment of the present invention.
Figure 2:
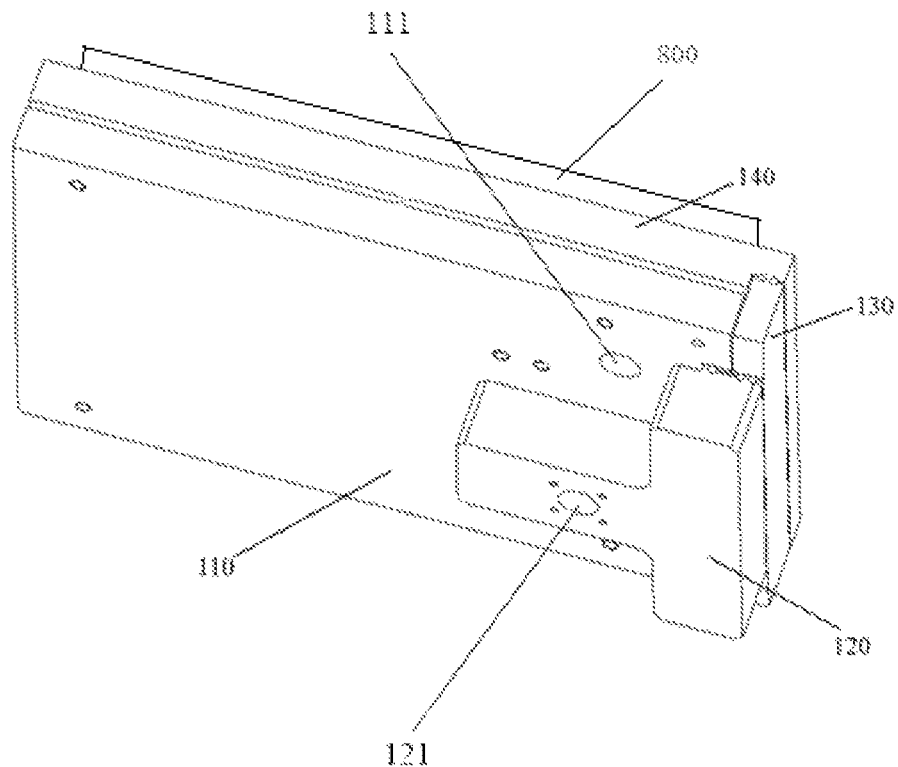
FIG. 2 is a structural schematic of a flexible mechanism according to an embodiment of the present invention.
Figure 3:
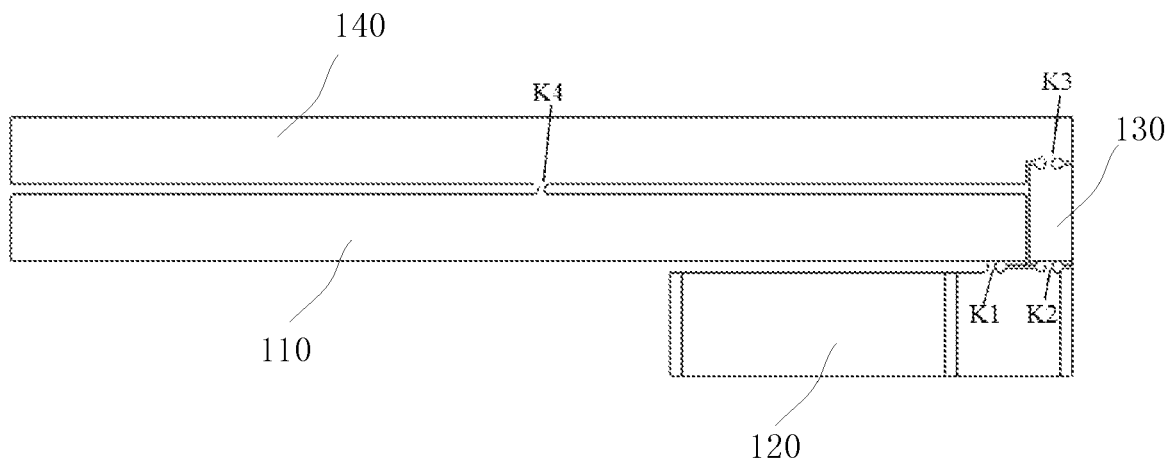
FIG. 3 schematically shows axes of flexible articulation in the flexible mechanism according to an embodiment of the present invention.

As shown in FIGS. 1 to 3, a prism 800 rotation adjustment mechanism according to the present invention includes a frame 200, a flexible mechanism 100 and an actuation mechanism. The flexible mechanism 100 includes a fixing component 110, an actuating component 120, a connecting component 130 and a swinging component 140, which are flexibly articulated together in a sequence. The fixing component 110, the actuating component 120, the connecting component 130 and the swinging component 140 are all block-shaped. The fixing component 110 is fixed to the frame 200. The actuation mechanism includes an actuator support 300 and an actuator unit 400 mounted on the actuator support 300. The actuator support 300 is fixed to the frame 200, and the actuator unit 400 is connected to the actuating component 120. The actuator unit 400 is implemented as a piezoelectric ceramic motor. One end of the fixing component 110 is in flexible articulation with a middle portion of the actuating component 120. One end of the actuating component 120 is in flexible articulation with one end of the connecting component 130, and the other end of the actuating component is a free end. The connecting component 130 is, at the other end, in flexible articulation with the swinging component 140. The swinging component 140 is flexibly articulated, in the middle, to the fixing component 110. On the swinging component 140, there are provided prism 800 rotatable about an axis of articulation between the swinging component 140 and the fixing component 110.

The flexible mechanism 100 of the prism 800 rotation adjustment mechanism of the present invention is a quadrilateral flexibly-articulated assembly, in which, the actuating component 120 can convert translational movement of the actuation mechanism into swinging of the swinging component 140 via mechanical transmission of the connecting component 130 and the fixing component 110 and hence into rotation of the prims on the swinging component 140. This allows the control of the rotational movement to be more accurate and hence to improve the rotation control accuracy of the prisms 800. Additionally, the axis of articulation between the swinging component 140 and the fixing component 110 provides a stable axis for the prisms 800 to rotate thereabout, thus ensuring the avoidance of crosstalk during the rotation and additionally improving the prism 800 rotation control accuracy. Further, the flexible articulations in the flexible mechanism 100 allows swinging of the quadrilateral assembly without issues that may arise from the use of mechanical articulations, such as gaps or inconvenience in mounting, which can result in a further improvement in the control accuracy.

The actuator unit 400 in the actuation mechanism may be connected to the actuating component 120 in a direct contact manner or by means of a steering structure, so that the translation of the actuator unit 400 can be converted into swinging of the actuating component 120. In the former case, control over rotation of the prisms 800 on the swinging component 140 is accomplished by a stroke of the actuator unit 400, which in turn controls an angle of swinging of the actuating component 120.

Figure 4:
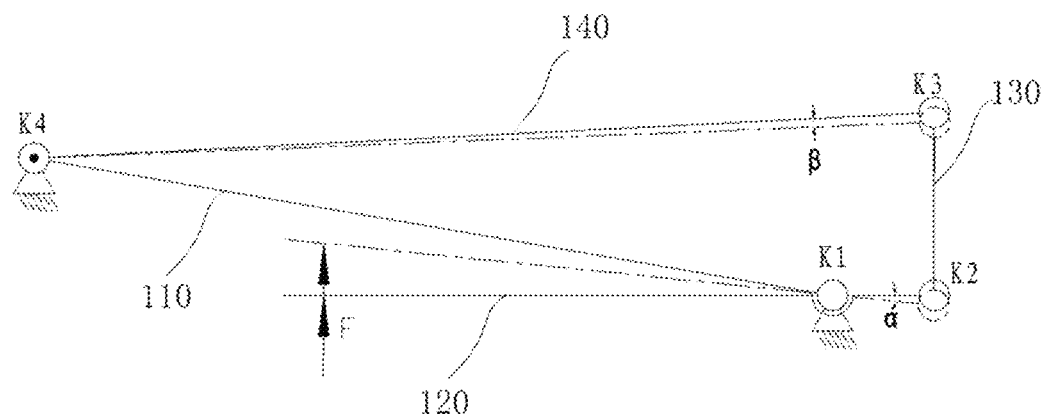
FIG. 4 schematically shows how the prism rotation adjustment mechanism operates in accordance with an embodiment of the present invention.

With particular reference to FIG. 4, the axis of articulation between the fixing component 110 and the actuating component 120 may be defined as a first axis of articulation K1, the axis of articulation between the actuating component 120 and the connecting component 130 as a second axis of articulation K2, the axis of articulation between the connecting component 130 and the swinging component 140 as a third axis of articulation K3 and the axis of articulation between the swinging component 140 and the fixing component 110 as a fourth axis of articulation K4. The first, second, third and fourth axes of articulation K1, K2, K3 and K4 may be formed by slotting. Specifically, the first axis of articulation K1 may be formed by slotting, i.e. removing materials between the fixing component 110 and the actuating component 120 except for the portion of the first axis of articulation K1. The second, third and fourth axes of articulation K2, K3 and K4 may be formed in the same way.

Further, the fixing component 110, the actuating component 120, the connecting component 130 and the swinging component 140 may be formed from a single piece through slotting it to establish the first, second, third and fourth axes of articulation K1, K2, K3 and K4 at predetermined positions.

When the free end of the actuating component 120 is subjected to a force F exerted by the actuator unit 400, the actuating component 120 pivots by an angle α at the end in articulation with the connecting component 130, causing the swinging component 140 to pivot by an angle β via mechanical transmission of the connecting component 130. As the prisms 800 are disposed on the swinging component 140 and rotatable about the axis of articulation between the swinging component 140 and the fixing component 110, it will rotate by the same angle β as the pivot of the swinging component 140. In this way, rotation of the prisms 800 can be accurately controlled through adjusting the pivot angle β of the swinging component.

Preferably, with reference to FIG. 1, the prism rotation adjustment mechanism may further include a detection unit 600 and a corresponding detection bracket 700 of the detection unit. The detection bracket 700 is vertically coupled to the swinging component 140. The detection bracket 700 passes through a through hole 111 in the fixing component 110 and aligns with the detection unit 600. The detection unit 600 is fixed to the frame 200 and constitutes a closed-loop control system together with the actuation mechanism.

In this arrangement, the closed-loop control system constituted by the detection unit 600 and the actuation mechanism can exert a real-time feedback control over angular displacement of the prisms 800. Based on angular displacement data provided to the actuation mechanism, the actuation mechanism and hence the prism rotation adjustment mechanism of the present invention can perform control with enhanced accuracy.

Preferably, the prism rotation adjustment mechanism may further include a pretension unit 500 implemented as a spring that abuts against the fixing component 110 at one end and is, at the other end, inserted through the through hole 121 in the actuating component 120 and fixed to the free end.

The pretension unit 500 can not only provide a reverse pretension force to the actuating component 120 and the swinging component 140 at their initial positions, which allows a wider prism rotation adjustment range, but can also increase the stiffness and order of structural mode of the prism rotation adjustment mechanism.

Figure 5:
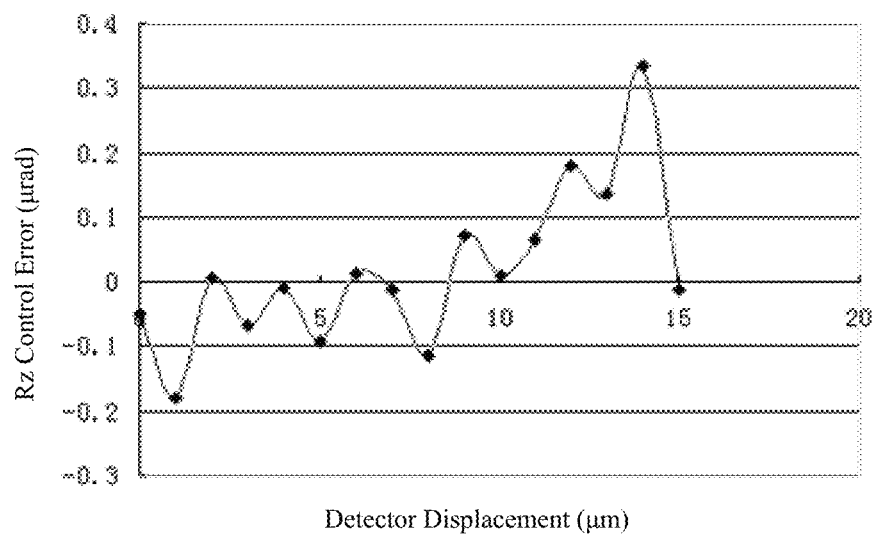
FIG. 5 shows measured control accuracy of the prism rotation adjustment mechanism in accordance with an embodiment of the present invention.

FIG. 5 shows control accuracy of the prism rotation adjustment mechanism of the present invention measured with a laser interferometer. In the figure, the abscissa represents displacement of the detector, whereas the ordinate represents the rotation control accuracy error. As can be seen from FIG. 5, the error ranges below 0.34 μrad, demonstrating that the control accuracy of the prism rotation adjustment mechanism of the present invention is much higher than that of the conventional objective adjustment mechanism. One of the reasons for this significant enhancement is the finer control granularity of the actuator unit 400 resulting from a longer effort arm and a greater effort arm length/load arm length ratio thereof.

Figure 6:
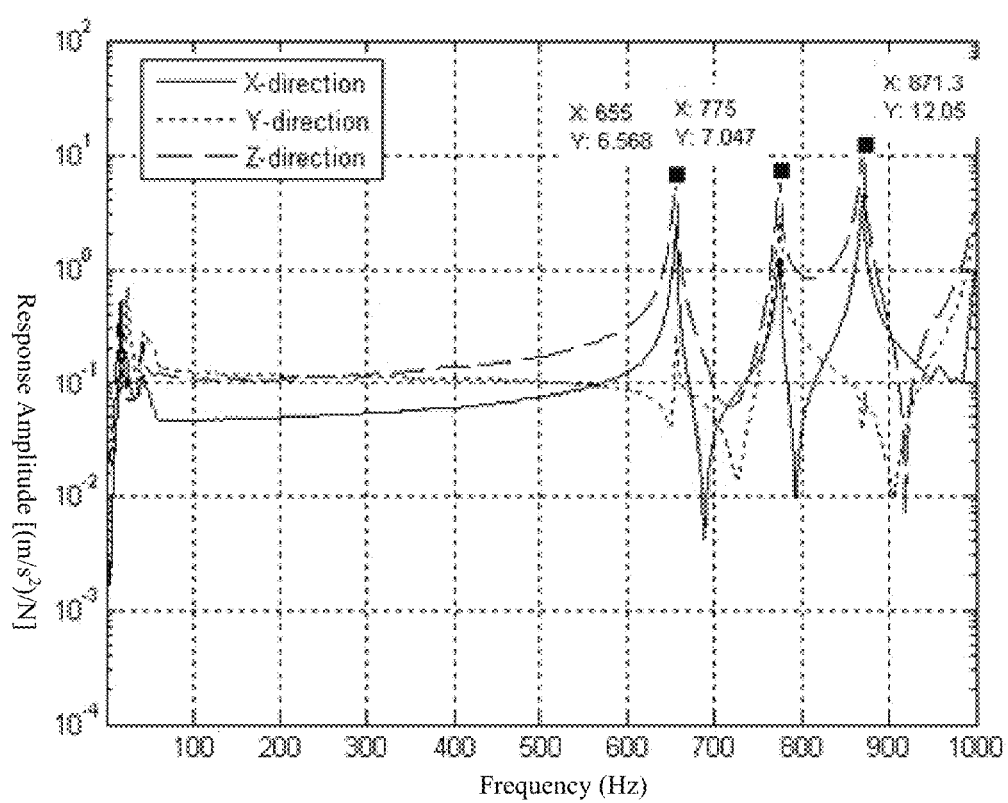
FIG. 6 shows results of a modal test performed on the prism rotation adjustment mechanism in accordance with an embodiment of the present invention.

FIG. 6 shows results of a modal test performed on the prism rotation adjustment mechanism of the present invention with a modal testing instrument. In the figure, the abscissa represents the frequency, whereas the ordinate represents the response amplitude. As can be seen from FIG. 6, the prism rotation adjustment mechanism was measured as having a first-order mode frequency of 655 Hz and a high order mode structure. Therefore, the prism rotation adjustment mechanism of the present invention is a high order mode structure with improved vibration response characteristics and enhanced rotation control accuracy.

With reference to FIGS. 1 to 3, the present invention also provides a photolithographic exposure system including a projection objective (not shown) and the prism rotation adjustment mechanism as defined above. The projection objective includes a number of prisms 800 fixedly attached to the prism rotation adjustment mechanism that can convert translational movement into rotational movement, allowing the control of the rotational movement to be more accurate and hence improving the rotation control accuracy of the prisms. Moreover, the axis of articulation between the swinging component 140 and the fixing component 110 provides a stable axis for the prisms to rotate thereabout, ensuring the avoidance of crosstalk during the rotation and hence additionally improving the prism rotation control accuracy.

With reference to FIGS. 1 to 3, the present invention also provides photolithography tool including the photolithographic exposure system as defined above, in which the prism rotation adjustment mechanism can convert translational movement into rotational movement allowing the control of the rotational movement more accuracy and hence improving the rotation control accuracy of the prisms. Moreover, the axis of articulation between the swinging component 140 and the fixing component 110 provides a stable axis for the prisms 800 to rotate therearound, ensuring the avoidance of crosstalk during the rotation and hence additionally improving the prism rotation control accuracy.

What is claimed is:

1. A prism rotation adjustment mechanism, comprising a frame, a flexible mechanism and an actuation mechanism, the flexible mechanism comprising a fixing component, an actuating component, a connecting component and a swinging component that are flexibly articulated in sequence directly, the fixing component fixed to the frame, the actuation mechanism fixed to the frame and coupled to the actuating component, the swinging component configured to secure a prism,
wherein only one axis of articulation is formed between the swinging component and the fixing component, so that the swinging component is rotatable with respect to the fixing component about the axis of articulation, and
wherein the axis of articulation is always a rotational center of the prism.

2. The prism rotation adjustment mechanism according to claim 1, wherein the fixing component is, at one end, in flexible articulation with a middle portion of the actuating component, wherein one end of the actuating component is in flexible articulation with one end of the connecting component and the other end of the actuating component is a free end, wherein the connecting component is, at the other end, in flexible articulation with the swinging component, and wherein the swinging component is flexibly articulated, in a middle portion thereof, to the fixing component.

3. The prism rotation adjustment mechanism according to claim 2, wherein the actuation mechanism is coupled to the free end.

4. The prism rotation adjustment mechanism according to claim 2, further comprising a pretension unit having one end abutting against the fixing component and the other end fixed to the free end.

5. The prism rotation adjustment mechanism according to claim 4, wherein the pretension unit is implemented as a spring abutting against the fixing component at one end and fixed to the free end at the other end.

6. The prism rotation adjustment mechanism according to claim 1, further comprising a detection unit and a corresponding detection bracket thereof, the detection bracket vertically coupled to the swinging component, the detection unit fixed to the frame and constituting a closed-loop control system together with the actuation mechanism.

7. The prism rotation adjustment mechanism according to claim 6, wherein the detection bracket is aligned with the detection unit after penetrating the fixing component.

8. The prism rotation adjustment mechanism according to claim 1, wherein the actuation mechanism comprises an actuator support and an actuator unit mounted on the actuator support, the actuator support in fixed connection with the frame, the actuator unit coupled to the actuating component.

9. The prism rotation adjustment mechanism according to claim 8, wherein the actuator unit is implemented as a piezoelectric ceramic motor.

10. The prism rotation adjustment mechanism according to claim 1, wherein the fixing component, the actuating component, the connecting component and the swinging component are all block-shaped.

11. The prism rotation adjustment mechanism according to claim 1, wherein the fixing component, the actuating component, the connecting component and the swinging component are formed from one piece.

12. A photolithographic exposure system comprising a projection objective and the prism rotation adjustment mechanism as defined in claim 1, the projection objective comprising a number of prisms fixedly attached to the prism rotation adjustment mechanism.

13. A photolithography tool, comprising the photolithographic exposure system as defined in claim 12.

* * * * *